(12) United States Patent
Le Vaillant

(10) Patent No.: US 7,473,620 B2
(45) Date of Patent: Jan. 6, 2009

(54) PROCESS FOR ADJUSTING THE STRAIN ON THE SURFACE OR INSIDE A SUBSTRATE MADE OF A SEMICONDUCTOR MATERIAL

(75) Inventor: Yves-Matthieu Le Vaillant, Crolles (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 124 days.

(21) Appl. No.: 11/372,868

(22) Filed: Mar. 10, 2006

(65) Prior Publication Data

US 2007/0166968 A1    Jul. 19, 2007

(30) Foreign Application Priority Data

Jan. 17, 2006    (FR) .................................. 06 000398

(51) Int. Cl.
*H01L 21/322* (2006.01)
(52) U.S. Cl. ................. 438/473; 438/471; 257/E21.319
(58) Field of Classification Search ................. 438/471, 438/473; 257/E21.319
See application file for complete search history.

(56) References Cited

U.S. PATENT DOCUMENTS

| 6,067,154 | A | 5/2000 | Hossain et al. ............ 356/237.2 |
| 6,642,106 | B1 | 11/2003 | Yang et al. ................... 438/257 |
| 2003/0218189 | A1* | 11/2003 | Christiansen et al. ........ 257/200 |
| 2004/0012075 | A1 | 1/2004 | Bedell et al. ................. 257/616 |
| 2004/0018701 | A1 | 1/2004 | Ueda .......................... 438/518 |
| 2004/0038468 | A1* | 2/2004 | Hwang et al. ................ 438/197 |
| 2004/0126998 | A1 | 7/2004 | Feudel et al. ................ 438/514 |
| 2004/0173815 | A1 | 9/2004 | Yeo et al. ..................... 257/192 |
| 2005/0017309 | A1* | 1/2005 | Weber et al. ................. 257/376 |
| 2005/0029560 | A1 | 2/2005 | Wasshuber et al. .......... 257/288 |
| 2006/0110882 | A1* | 5/2006 | Liu et al. ..................... 438/257 |

FOREIGN PATENT DOCUMENTS

JP      2004111638      4/2004
WO    WO 2004/095553 A2    11/2004

OTHER PUBLICATIONS

Austrian Search Report corresponding to Singapore Appln. No. 200700250-4.

* cited by examiner

*Primary Examiner*—Bradley K Smith
(74) *Attorney, Agent, or Firm*—Winston & Strawn LLP

(57) ABSTRACT

This invention relates to a process for adjusting the strain in a strained layer on a substrate. The process steps include identifying one or more regions of the strained layer wherein the strain is to be adjusted; implanting elements into at least one of the regions thus identified in the strained layer; annealing the substrate with the strained layer to a temperature maintained for a sufficiently long time to cure crystalline defects caused by the implantation in the implanted region or regions.

17 Claims, 1 Drawing Sheet

PROCESS FOR ADJUSTING THE STRAIN ON THE SURFACE OR INSIDE A SUBSTRATE MADE OF A SEMICONDUCTOR MATERIAL

BACKGROUND ART

The invention relates to a process for adjusting the strain of a strained layer on the surface or inside a substrate made of a semiconductor material. For example, the invention relates to a process for locally adjusting the strain in one or several layers on a substrate made of a semiconductor material.

The invention also relates to a process of adjusting the strain on a part of the surface or on the entire surface of a substrate made of a semiconductor material with a surface or buried strained layer. In general, the invention is applicable to all types of strained layers on a substrate made of a semiconductor material and with a non-homogenous strain, on the surface of the layer or within the depth of this layer.

The process according to the invention is particularly suitable for making a local adjustment to the strain in a layer obtained by epitaxy on a substrate. The invention also relates to a strained layer on a substrate made of a semiconductor material having less defects by being obtained by the process according to the invention. Finally, the invention relates to a wafer made of a semiconductor material comprising at least one such layer.

The use of a strained layer on a substrate is particularly attractive because it can increase the mobility of charge carriers within semiconductor structures. A person skilled in the art will be familiar with several techniques and processes for creating a strain within a layer on a substrate. For example, a silicon layer may be strained by epitaxy on a substrate for which the elementary mesh parameter in the epitaxy plan is not the same as the mesh parameter for silicon. Such a process is better known under the name of pseudomorphic epitaxy. With this process, the surface of the strained layer is analyzed to show that there is a non-homogeneity in the strain of the order of 1% of the maximum strain, measured between the centre and the edge of the substrate.

With this process, the sources of this non-homogeneity of the strain in the substrate layer may be:
- a non-homogeneity in the composition of the alloy (for example SiGe) used in the pseudo-substrate obtained by epitaxy on the solid substrate (homogeneity of the temperature on the pseudo-substrate during epitaxy, constant gas flows in the reactor); or
- relaxation of strain due to heat treatments (thermal oxidation, post-epitaxy heat treatments, etc.).

Thus, the precision of existing processes for obtaining the required strain in the layer concerned is limited, and it would be advantageous to improve this precision to achieve good mobility of charges within the strained layer.

Obviously, existing processes could be improved by carrying out more frequent checks of the temperature of heating lamps and gas flows in the reactor, and the precision of these installations could also be improved. Another possibility is to provide an additional treatment process carried out after a known process for producing a strained layer. The purpose of this invention is to provide such a process.

SUMMARY OF THE INVENTION

The invention relates to a process for adjusting strain in a strained layer on a substrate which comprises identifying one or more regions of the strained layer where the strain is to be adjusted; implanting elements into at least one of the identified regions in the strained layer in an amount sufficient to cure or reduce defects when subjected to elevated temperatures; and annealing the substrate and strained layer by heating to a temperature for a time sufficient to reduce or cure crystalline defects in the one or more regions of the strained layer which include the implanted elements. The chemical element implantation step is advantageously conducted with the implantation energy adapted as a function of depth of the identified region so that the dose of implanted chemical elements is sufficient to measurably modify the strained state of the identified region. Also, at least one region is preferably identified by Raman spectroscopy or by X-ray diffraction.

The surface of the substrate can be provided with a protective coating where the elements are to be implanted to protect the surface from damage. Suitable protecting layers include an oxide or nitride deposit having a uniform or non-uniform thickness, or that is applied selectively.

The invention also relates to an annealed structure comprising a strained layer and a substrate, wherein the strained layer includes one or more regions that include implanted elements so that during annealing the strain is adjusted to reduce or cure crystalline defects. The structure is preferably included in a wafer wherein at least the strained layer is made of a semiconductor material.

BRIEF DESCRIPTION OF THE DRAWINGS

Other characteristics, purposes and advantages of this invention will become clear after reading the detailed description given below with reference to the appended drawings given as non-limitative examples, on which.

DETAILED DESCRIPTION OF THE PREFERRED EMBODIMENTS

Figure 1:
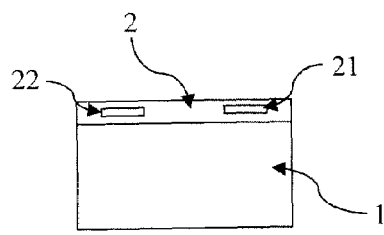
FIGS. 1, 2 and 3 show sectional views of a wafer of semiconductor material formed from a substrate and a strained layer illustrating different types of regions for which the strain is to be adjusted.

This present process adjusts the strain in a strained layer on a substrate by conducting the following steps:
- identify one or more regions of the strained layer wherein the strain is to be adjusted;
- implant elements into at least one of the regions thus identified in the strained layer; and
- anneal the substrate with the strained layer to a temperature maintained for a sufficiently long time to cure crystalline defects caused by the implantation in the implanted region(s).

The process according to the invention has one or more preferred characteristics. For example, the strain adjustment can be local; as needed, and can be achieved whether the strained layer is a surface layer or is buried under other layers. Thus, the identified region can be located on the surface of the strained layer or as a buried region in the strained layer.

The nature of the implanted elements can vary depending upon the specific results desired. The implanted element can be identical to at least one of the chemical elements forming the strained layer. For example, for a strained silicon or strained silicon-germanium layer, the implanted element preferably is silicon. When the silicon-germanium layer has a higher proportion of germanium rather than silicon, the implanted element can also be germanium.

The annealing step may be performed within a temperature range between 850° C. and 950° C. for a duration of between two and four hours. Preferably, the annealing step is performed under argon at a constant temperature of 900° C. for a duration of three hours.

To treat several regions in the strained layer, the implantation step that follows the annealing step can be performed several times. The cured defects in the regions of the strained layer enable the layer to be highly desirable for use in semiconductor applications. Thus, a strained layer produced by the process of the invention is useful as a semiconductor structure or in a wafer of semiconductor material comprising the same.

The process can also include a further step of protecting the strained layer by depositing a protecting layer. The protecting layer may be a layer of any material that protects the strained layer from damage or deterioration due to the implanting step. Advantageous materials include oxides or nitrides formed by deposition. In particular, a tetra ethyl ortho silicate (TEOS) deposit having a thickness of 50 to 150 Angstroms is suitable for this purpose. Alternatively, any other compatible oxides or nitrides can be used for the protecting layer. Other deposited oxides could be used including those formed from precursors such as silanes or dichlorosilanes. The deposit needs to cover only the regions that are to be implanted. After the strain has been adjusted in the selected regions by the implanting, the protecting layer can be removed if desired by polishing or other selective removal techniques.

As noted, the specific purpose of this invention is to adjust the strain in one or several strained layers in or on a substrate. A strained layer in the scope of the invention means a layer formed from a crystalline material for which the elementary mesh parameter is different from the natural elementary mesh parameter of this material, under given temperature and pressure conditions. Within the scope of the invention, the purpose is to make a small adjustment of this strain since the mobility of charges is very sensitive to this strain. The precision on the strain level in the layer concerned is an important factor in improving the performances of microelectronic or optoelectronic devices.

Therefore, the invention relates to an additional process used at the end of the process for manufacturing a strained layer on a substrate and comprising a step after the region(s) of the strained layer in which the strain is to be adjusted has (have) been identified, to implant chemical elements followed by a heat treatment step (also called the annealing step). To identify the region(s) in the strained layer in which the strain is to be adjusted, this strain needs to be measured. This is done using a non-destructive metrology process, such as Raman spectroscopy or X-ray diffraction. These metrology processes are well known to the skilled artisans so that further discussion of such processes are not needed herein. The measurement by Raman or X-Ray provides a strain value. This value can be compared to the precise strain target value of the layer, and then the strain can be adjusted by implantation to attain precisely the target value.

Figure 2:
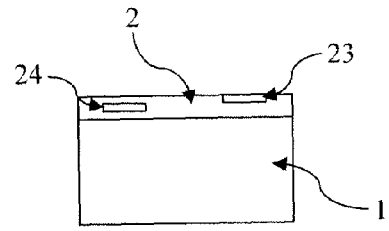
Figure 3:
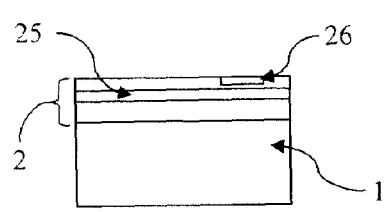

The region(s) to be treated may be located on the surface of the layer and/or in-depth in this layer, as shown in FIGS. 1 to 3. These figures show a wafer of semiconductor material formed from a substrate 1 and a strained layer 2 on the substrate 1, and regions 21, 22, 23, 24, 25, 26 in the strained layer in which it is required to adjust the strain. In general, regions 21, 22, 23, 24, 25, 26 that are to be treated are defined in an XY plane and/or according to the depth Z of the strained layer 2.

More precisely, FIG. 1 shows two regions 21, 22 located in depth in the strained layer 2 (i.e., buried in the substrate), in other words located at a non-zero depth Z from the surface of this layer 2. FIG. 2 itself shows two regions 23, 24, one of which 23 is located on the surface of the strained layer 2 and the other 24 is located in depth in this layer 2. FIG. 3 illustrates two regions 25, 26 in the strained layer 2 for which it is required to adjust the strain, in which one region 25 is located in depth and occupies the entire intersection surface of the XY plane with the strained layer 2 at a certain non-zero depth Z from the surface of the strained layer 2.

The strain is adjusted by implanting chemical elements. Once the regions are identified where the strain is to be adjusted, the chemical elements can be implanted selectively. This can be accomplished a number of ways. The implanting device can be selectively positioned only over those regions. This can be achieved by moving either the substrate, the implanter or both to properly position the implanter over the regions that need implanting.

Figure 5:
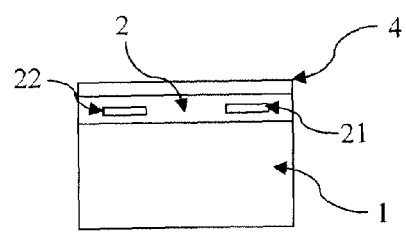
FIG. 5 shows a sectional view of a wafer of semiconductor material formed from a substrate, a strained layer with regions for which the strain is to be adjusted, and a protective oxide coating of uniform thickness over the entire surface.
Figure 7:
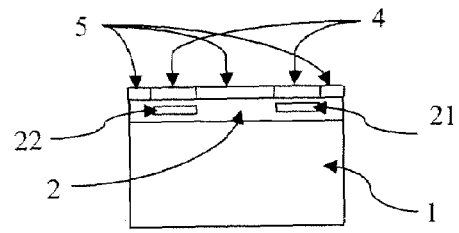
FIG. 7 shows a sectional view of a wafer of semiconductor material formed from a substrate, a strained layer with regions for which the strain is to be adjusted, a mask covering regions not to be implanted, and an oxide protective layer selectively applied over the implanted areas.

Alternatively, once you know where to implant, it is possible to deposit the protective oxide coating 4 over the entire surface and then implant selectively FIG. 5, or the coating and implanted elements can be provided selectively so that only those areas that are to be implanted are provided with the protective coating 4 and are exposed to the implanted elements. This can be done by use of a mask 5 that is impervious to the implanting species FIG. 7, so that first the coating 4 and then the chemical elements are directed only upon the appropriate regions where the strain needs to be adjusted. The masking techniques include those used in photolithography. The mask must be made of any deposited species that is able to: (1) make a good implantation barrier; and (2) be removed easily.

Figure 6:
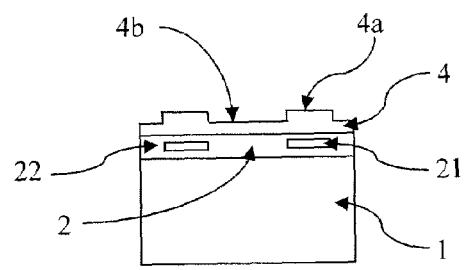
FIG. 6 shows a sectional view of a wafer of semiconductor material formed from a substrate, a strained layer with regions for which the strain is to be adjusted, and a protective oxide coating of non-uniform thicknesses over the surface.

Another possibility is to deposit different thicknesses of oxides 4 on the surface, with a relatively thicker oxide layer 4a provided in the regions to be implanted and a relatively thinner oxide layer 4b provided in other surface areas as shown in FIG. 6. Silicon dioxide or nitride are useful for this purpose.

The chemical element implantation step must be done such that the dose of implanted chemical elements is sufficient to measurably modify the strained state of the strained layer concerned. The implantation energy is adapted as a function of the depth of the identified region. The implanted chemical elements may be electrically neutral elements, namely atom or molecule type elements, or electrically charged elements, namely ion type elements, as desired. The skilled artisan can conduct routine tests to determine which species provide optimum results for the particular situation. Implanted elements are chosen as a function of the nature of the target region of the strained layer concerned.

It is preferable to choose elements to be implanted that are identical to one of the chemical elements forming the target strained layer. For example it will be preferred to implant silicon ions in a silicon strained layer. Similarly, if a target strained layer is composed of several elements of different natures, it will be preferred to implant elements for which the nature is identical to at least one of the chemical elements forming the target strained layer. For example, it will be preferred to implant either silicon, or germanium, or both successively in a target strained layer formed from silicon and germanium. Therefore, two elements with distinct natures may be implanted in sequence in the strained layer.

This implantation enables a modification to the strained state of the target layer. If the target strained layer is in compression, its strain in compression will be increased by the implantation of elements. On the other hand, if this target strained layer is in tension, then the implantation of elements reduces its tensile strain.

Typically, the dose of implanted chemical elements and the implantation energy are determined so as to obtain a variation of the order of 1% of the mass density before implantation. For example, for a silicon strained layer in which the implantation is made with atom type chemical elements, it will be possible to envisage doses varying from 1e15 to 2e15 atoms/cm$^2$ with an implantation energy of between 10 and 12 keV. Preferably in this case, a dose of the order of 2e15 atoms/cm$^2$ could be envisaged with an energy of the order of 12 keV.

The above description refers to a strained layer to which the process is applied, but obviously the process according to the invention may be applied to several layers arranged on the same substrate, for example such as double SOI type multi-layer structures that can be envisaged within the scope of the invention.

Figure 4:
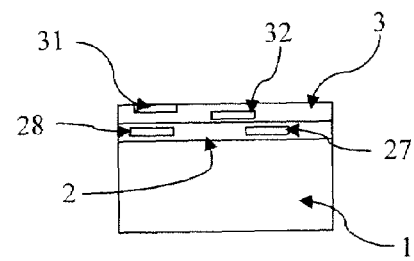
FIG. 4 shows a sectional view of a wafer of semiconductor material formed from a substrate and several strained layers illustrating different types of regions for which the strain is to be adjusted.

FIG. 4 shows a wafer made of a semiconductor material formed from a substrate 1 and several strained layers 2, 3 comprising regions 27, 28, 31, 32 for which it is required to adjust the strain. Once again, these regions 27, 28, 31, 32 are defined in an XY plane and/or depending on the depth Z of the strained layer 2.

The only important characteristic of a layer is that it is strained, and this strained layer may be strained in tension or in compression, it may originate from a process making use of the SMART-CUT® technology, or it may be non-crystalline, or it may comprise elements of different natures depending on the region in this layer.

Within the scope of this invention, the strain in a predetermined region of a layer may be adjusted locally either by using masks, or by varying the implantation energy and the dose of implanted elements. The implantation step may be made in one or several steps for the same region. The implantation step may also be made several times consecutively to adjust the local strain in different regions of one or several layers.

The annealing step is done under a neutral atmosphere or within a temperature range between 850° C. and 950° C. for durations varying from 2 to 4 hours. Preferably, this annealing step is done under argon, at a constant temperature of 900° C. for a duration of three hours. The two implantation and annealing steps may be done once or several times consecutively, always beginning with the implantation step.

The processes used for the implantation step and for the annealing step must each be reversible. Reversible for the implantation step means that the geometric structures of the target layer or the non-target layers through which the implanted elements pass are not modified. For example, a crystalline state of the target strained layer must not be modified into an amorphous state of this target layer such that it would not be recoverable in the annealing step. Reversible for the annealing step means that the temperature and the hold time of this temperature must be determined so as to limit inter-diffusion and other phenomena accompanying this annealing step.

EXAMPLE

The following describes a non-limitative example of how the process according to this invention can be implemented.

A process is applied to create a tensile strain in a silicon layer, and the stress is then measured. The measurement is made using non-destructive Raman or X-ray diffraction type metrology, and results in a stress of 1600 MPa on a local area in this layer. This value can be corrected by about a hundred MPa to give a final value of 1500 MPa, by firstly protecting the silicon layer with a TEOS deposit with a thickness of 50 to 150 Angstroms (preferably 100 Angstroms), and the implantation step is then performed with silicon atoms at a dose of 2e15 atoms/cm$^2$, an energy of 12 keV, and the annealing step is done using the processes described above.

Obviously, this invention is not limited to the embodiments presented above but can be extended to include any process conforming with its spirit, in other words any process designed to adjust the strain in one or several strained layers and for one or several regions in the target strained layer or in each target strained layer, after use of a process for straining the strained layer(s) concerned.

The invention claimed is:

1. A process for adjusting strain in a strained layer on a substrate which comprises:
   identifyiing one or more regions of the strained layer where the strain is to be adjusted;
   implanting elements, wherein at least one of the implanted elements is identical to at least one of the chemical elements forming the strained layer, into at least one of the identified regions in the strained layer in an amount sufficient to cure or reduce defects when subjected to elevated temperatures; and
   annealing the substrate and strained layer by heating to a temperature for a time sufficient to reduce or cure crystalline defects in the one or more regions of the strained layer which include the implanted elements.

2. The process of claim 1, wherein the annealing step is performed within a temperature range between 850° C. and 950° C.

3. The process of claim 1, which further comprises protecting the strained layer by depositing a protecting layer.

4. The process of claim 3, wherein the protecting layer is an oxide or nitride deposit having a thickness of 50 to 150 Angstroms.

5. The process of claim 3, wherein the protecting layer is applied selectively or of a non-uniform thickness.

6. The process of claim 5, which further comprises selectively applying the protective layer by depositing a mask over the areas where no implantation is to occur made of a material impervious to the implantation species, and by depositing a protective layer over the unmasked areas.

7. The process of claim 1, wherein the chemical element implantation step is conducted with the implantation energy adapted as a function of depth of the identified region so that the dose of implanted chemical elements is sufficient to measurably modify the strained state of the identified region.

8. The process of claim 1, wherein the at least one region is identified by Raman spectroscopy or by X-ray diffraction.

9. The process of claim 1, wherein the strain adjustment is local.

10. The process of claim 1, wherein the strained layer is a surface layer.

11. The process of claim 1, wherein the strained layer is buried in the substrate.

12. The process of claim 1, wherein the identified region is located on the surface of the strained layer.

13. The process of claim 1, wherein the identified region is located in a buried region in the strained layer.

14. The process of claim 1, wherein the annealing step is performed at a constant temperature for a duration comprised between two and four hours.

15. The process of claim 1, wherein the annealing step is performed under argon at a constant temperature of 900° C. for a duration of three hours.

16. A process for adjusting strain in a strained layer on a substrate which comprises:
   identifying one or more regions of the strained layer where the strain is to be adjusted;
   implanting elements, wherein the strained layer is composed of two different elements and the implanted elements are the same as those two elements and are implanted sequentially, into at least one of the identified regions in the strained layer in an amount sufficient to cure or reduce defects when subjected to elevated temperatures; and
   annealing the substrate and strained layer by heating to a temperature for a time sufficient to reduce or cure crystalline defects in the one or more regions of the strained layer which include the implanted elements.

17. A process for adjusting strain in a strained layer on a substrate which comprises:
   identifying regions of the strained layer where the strain is to be adjusted;
   implanting elements into at least one of the identified regions in the strained layer in an amount sufficient to cure or reduce defects when subjected to elevated temperatures; and
   annealing the substrate and strained layer by heating to a temperature for a time sufficient to reduce or cure crystalline defects in the one or more regions of the strained layer which include the implanted elements, wherein the implantation step followed by the annealing step are performed several times consecutively to treat several regions in the strained layer.

* * * * *

UNITED STATES PATENT AND TRADEMARK OFFICE
CERTIFICATE OF CORRECTION

PATENT NO. : 7,473,620 B2 Page 1 of 1
APPLICATION NO. : 11/372868
DATED : January 6, 2009
INVENTOR(S) : Le Vaillant It is certified that error appears in the above-identified patent and that said Letters Patent is hereby corrected as shown below:

<u>Column 6</u>:
Line 30 (claim 1, line 3), change "identifyiing" to -- identifying --.

Signed and Sealed this

Seventeenth Day of February, 2009

JOHN DOLL
*Acting Director of the United States Patent and Trademark Office*